(12) United States Patent
Annunziata et al.

(10) Patent No.: US 9,054,300 B2
(45) Date of Patent: Jun. 9, 2015

(54) THERMALLY ASSISTED MRAM WITH A MULTILAYER ENCAPSULANT FOR LOW THERMAL CONDUCTIVITY

(71) Applicant: International Business Machines Corporation, Armonk, NY (US)

(72) Inventors: Anthony J. Annunziata, Stamford, CT (US); Michael C. Gaidis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/971,518

(22) Filed: Aug. 20, 2013

(65) Prior Publication Data

US 2014/0356979 A1 Dec. 4, 2014

Related U.S. Application Data

(63) Continuation of application No. 13/909,506, filed on Jun. 4, 2013.

(51) Int. Cl.
*H01L 21/00* (2006.01)
*H01L 43/12* (2006.01)
*H01L 43/02* (2006.01)

(52) U.S. Cl.
CPC ............... *H01L 43/12* (2013.01); *H01L 43/02* (2013.01)

(58) Field of Classification Search
None
See application file for complete search history.

(56) References Cited

U.S. PATENT DOCUMENTS

| 6,839,271 | B1 | 1/2005 | Anthony et al. |
| 8,064,245 | B2 | 11/2011 | Prejbeanu |
| 8,102,701 | B2 | 1/2012 | Prejbeanu et al. |
| 8,289,765 | B2 | 10/2012 | Javerliac et al. |
| 2006/0054947 | A1 | 3/2006 | Asao et al. |
| 2011/0089511 | A1* | 4/2011 | Keshtbod et al. ............. 257/422 |
| 2011/0110151 | A1 | 5/2011 | Prejbeanu |
| 2012/0008380 | A1 | 1/2012 | El Baraji et al. |
| 2012/0205762 | A1 | 8/2012 | Matsukawa et al. |

OTHER PUBLICATIONS

Application No. CN101465407; Issue Date: Jun. 24, 2009; Assignee: Commissariat Energie Atomique; English Abstract; 2 pages.
Application Number: JP2007243170; Issue Date: Sep. 20, 2007; Assignee: Qimonda North America Corp; English Abstract; 2 pages.

* cited by examiner

*Primary Examiner* — Evan Pert
*Assistant Examiner* — Herve Assouman
(74) *Attorney, Agent, or Firm* — Cantor Colburn LLP; Vazken Alexanian (57) ABSTRACT

A technique is provided for a thermally assisted magnetoresistive random access memory device. A magnetic tunnel junction is formed. Contact wiring having a top contact electrode and a bottom contact electrode is formed. The contact wiring provides write bias to heat the magnetic tunnel junction. A multilayer dielectric encapsulant is configured to retain the heat within the magnetic tunnel junction.

7 Claims, 4 Drawing Sheets

FIG. 4

THERMALLY ASSISTED MRAM WITH A MULTILAYER ENCAPSULANT FOR LOW THERMAL CONDUCTIVITY

CROSS REFERENCE TO RELATED APPLICATIONS

The present application is a continuation of U.S. patent application Ser. No. 13/909,506, entitled THERMALLY ASSISTED MRAM WITH A MULTILAYER ENCAPSULANT FOR LOW THERMAL CONDUCTIVITY", filed on Jun. 4, 2013, which is incorporated herein by reference in its entirety.

BACKGROUND

The present invention relates generally to magnetic memory devices, and more specifically, to utilizing a multilayer encapsulant.

Magnetoresistive random access memory (MRAM) is a non-volatile computer memory (NVRAM) technology. Unlike conventional RAM chip technologies, MRAM data is not stored as electric charge or current flows, but by magnetic storage elements. The elements are formed from two ferromagnetic plates, each of which can hold a magnetic field, separated by a thin insulating layer. One of the two plates is a reference magnet set to a particular polarity; the other plate's field can be changed to match that of an external field to store memory and is termed the "free magnet" or "free-layer". This configuration is known as a magnetic tunnel junction and is the simplest structure for a MRAM bit. A memory device is built from a grid of such "cells". In some configurations of MRAM, which includes the type discussed below, both the reference and free layers of the magnetic tunnel junctions can be switched using an external magnetic field; in this case, heat is used to depin the reference layer, and the data is stored in the reference layer.

One method of reading is accomplished by measuring the electrical resistance of the cell. A particular cell is (typically) selected by powering an associated transistor which switches current from a supply line through the cell to ground. Due to the magnetic tunnel effect, the electrical resistance of the cell changes due to the orientation of the magnetization in the two plates. By measuring the resistance of any particular cell, the direction of magnetization of the writable plate (i.e., the free layer) can be determined.

SUMMARY

According to one embodiment, a thermally assisted magnetoresistive random access memory device is provided. The thermally assisted magnetoresistive random access memory device includes a magnetic tunnel junction, and contact wiring having a top contact electrode and a bottom contact electrode. The contact wiring provides write bias to heat the magnetic tunnel junction. The thermally assisted magnetoresistive random access memory device includes a multilayer dielectric encapsulant configured to retain the heat within the magnetic tunnel junction.

According to one embodiment, a method of fabricating a thermally assisted magnetoresistive random access memory device is provided. The method includes forming a magnetic tunnel junction, disposing contact wiring having a top contact electrode and a bottom contact electrode, where the contact wiring provides write bias to heat the magnetic tunnel junction, and forming a multilayer dielectric encapsulant configured to retain the heat within the magnetic tunnel junction.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Thermally-assisted magnetoresistive random access memory (TAS-MRAM) entails heating of the magnetic tunnel junction (MTJ) stack to a write temperature ($T_{write}$) higher than the operating temperature ($T_{op}$) in order to write to the device. This is typically done by Joule heating from a bias current that is applied during the write process. The amount of power required to heat the device to $T_{write}$ depends on the thermal conductivity between the device and the surrounding structures and substrate, and the surrounding structures and substrates are at the temperature $T_{op} < T_{write}$.

For typical TAS-MRAM devices and structures, the power required (to generate the bias current for Joule heating) is undesirably large because the thermal conductivity is large. The thermal conductivity of the device allows heat to leak from the MTJ stack to the surrounding structures and substrates.

Embodiments of the invention reduce the power required to heat the device to $T_{write}$ by reducing the thermal conductivity between the device and dielectric that surrounds the device, which have an operating temperature $T_{op}$. Embodiments utilize interfacial thermal resistance (also referred to as boundary resistance or Kapitza resistance in the literature) in the encapsulation of the TAS-MRAM device to allow small thermal conductivity between the device and the surrounding dielectric and other structures. In insulators, where heat conduction is primarily via phonons, interfacial resistance from multilayers of dissimilar dielectric layers can substantially decrease the thermal conductivity compared to a single dielectric layer of the same thickness according to embodiments.

Figure 1:
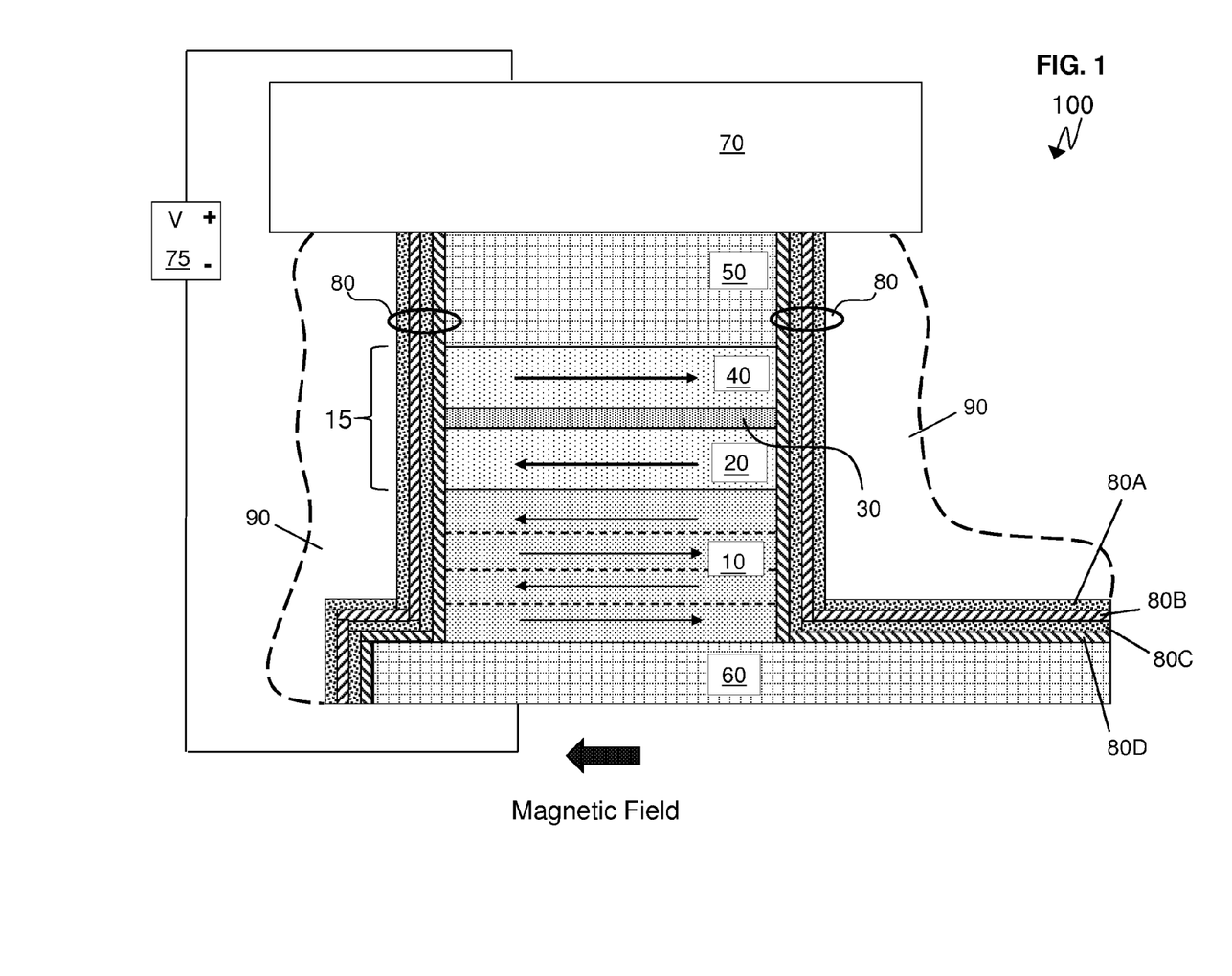
FIG. 1 illustrates a structure for a thermally-assisted magnetoresistive random access memory (TAS-MRAM) device according to an embodiment.

FIG. 1 illustrates a structure for a thermally-assisted magnetoresistive random access memory (TAS-MRAM) device 100 according to an embodiment. The TAS-MRAM device 100 is designed to reduce, eliminate, and/or nearly eliminate thermal coupling between the TAS-MRAM device 100 and surrounding structures 90 during writing (i.e., during data programming).

The TAS-MRAM device 100 is a structure that includes an antiferromagnetic layer 10. The antiferromagnetic layer 10 is an antiferromagnet and may include materials such as, e.g., IrMn, FeMn, PtMn, etc. The antiferromagnetic layer 10 may be composed of two or more magnetic sublattices. The two or more magnetic sublattices have opposite magnetic orientations (also referred to as magnetic moments), such that the net magnetic moment of the antiferromagnetic layer 10 is zero and/or very close to zero. This is schematically shown in the FIG. 1 as a layered structure with opposite pointing arrows representing different sublattices with opposite magnetic orientations (i.e., arrows). As such, each sublattice has its own arrow representing its magnetic orientation. For example, in the antiferromagnetic layer 10, the top sublattice has a left magnetic orientation while its adjacent sublattice has a right magnetic orientation, the next adjacent sublattice has a left magnetic orientation, and the bottom sublattice has a right magnetic orientation. Since antiferromagnets have a small or no net magnetization, their spin orientation is only weakly influenced by an externally applied magnetic field.

A ferromagnetic storage layer 20 is disposed on top of the antiferromagnetic layer 10, a non-magnetic tunnel barrier 30 is disposed on top of the ferromagnetic storage layer 20 (alternatively the storage layer 20 may be a synthetic antiferromagnetic storage layer), and a ferromagnetic sense layer 40 is disposed on top of the non-magnetic tunnel barrier 30. The ferromagnetic storage layer 20, non-magnetic tunnel barrier 30, and ferromagnetic sense layer 40 together form a magnetic tunnel junction (MTJ) 15 as understood by one skilled in the art. The resistance of the magnetic tunnel junction 15 is utilized to read and write to the device 100. The magnetic orientation (magnetic moment) of any layer is shown by an arrow pointing left or right.

The TAS-MRAM device 100 further includes a device thermal barrier 50 disposed on the ferromagnetic sense layer 40, and the antiferromagnetic layer 10 is disposed on a bottom contact electrode 60. The bottom contact electrode 60 can also act as a thermal barrier. A top contact electrode 70 is disposed on top of the device thermal barrier 50. A multilayer dielectric encapsulant 80 surrounds the TAS-MRAM device 100, and particularly, the encapsulant surrounds the MTJ 15.

In a typical existing device, the encapsulant is a single dielectric of, e.g., SiN. However, in an embodiment of the TAS-MRAM device 100, the multilayer dielectric encapsulant 80 is formed out of multiple alternating layers of two or more adjacent different dielectric (or other high electrical resistance) materials 80A, 80B, 80C, 80D, and so forth, which limit and/or block the flow of phonons through the interfaces of the adjacent materials.

Particularly, according to embodiments, each of the adjacent dielectric materials of the encapsulant 80 have differing crystal lattice properties, differing density/hardness, differing deposition techniques, and/or differ in some other way so as to cause a discontinuity in phonon transmission through the interfaces between each of the multiple dielectric layers 80A-80D. The different layers 80A-80D decrease and/or block the thermal conductivity (e.g., of phonons) through the multilayer dielectric encapsulant 80 compared to the typical case of a single encapsulant film.

A phonon is a collective excitation in a periodic, elastic arrangement of atoms or molecules in condensed matter, such as solids and some liquids. Often referred to as a quasiparticle, the phonon represents an excited state in the quantum mechanical quantization of the modes of vibrations of elastic structures of interacting particles. Phonons play a major role in many of the physical properties of condensed matter, such as thermal conductivity and electrical conductivity. Also, a phonon is a quantum mechanical description of an elementary vibrational motion in which a lattice of atoms or molecules uniformly oscillates at a single frequency. Phonons have wave-like and particle-like properties as they travel through a structure.

Now, an example of writing the TAS-MRAM device 100 is discussed. A voltage source 75 is connected to the top contact electrode 70 and the bottom contact electrode 60. Voltage of the voltage source 75 is applied to the TAS-MRAM 100 to generate a write current (write bias). As one example (according to a conventional current flow), the write current flows into the top contact electrode 70, in the device thermal barrier 50, in the ferromagnetic sense layer 40, in the non-magnetic tunnel barrier 30, in the ferromagnetic storage layer 20, in the antiferromagnetic layer 10, out through the bottom contact electrode 60, and back to the voltage source 75. The non-magnetic tunnel barrier 30 is primarily responsible for heating the device 100 (particularly the MTJ 15) to write temperature $T_{write}$ via Joule heating, because of the high resistance of the non-magnetic tunnel barrier 30. The heat generated by the non-magnetic tunnel barrier 30 heats layers 10, 20, and 40, while thermal barriers 50 and 60 help to prevent the heat from escaping.

As noted above, the multilayer dielectric encapsulant 80 reduces the power required to heat the device to $T_{write}$ by reducing the heat (thermal conductivity) between the device 100 and the substrate and surrounding areas 90 (such as dielectrics and other devices 100 packed tightly to the device 100). The multilayer encapsulant 80 utilizes interfacial thermal resistance (also referred to as boundary resistance or Kapitza resistance in the literature) in the encapsulation of the TAS-MRAM device 100 to allow small thermal conductivity between the device 100 and the surrounding dielectric and other structures 90. Since the interfacial resistance from multilayers of dissimilar dielectric layers of the multilayer dielectric encapsulant 80 decreases and/or blocks the flow of heat from escaping the non-magnetic tunnel barrier 30, the multilayer encapsulant 80 reduces the amount of voltage and/or write current which needs to be generated by the voltage source 75 to heat the non-magnetic tunnel barrier 30.

Returning to the example of writing by heating the device 100 to the write temperature, the heat of the non-magnetic tunnel barrier 30 destabilizes the magnetic orientation of the antiferromagnetic layer 10, which depins the ferromagnetic storage layer 20 An externally generated magnetic write field (represented by the solid arrow) is applied to switch the magnetic orientation (e.g., from the right magnetic orientation to the left magnetic orientation) of the ferromagnetic storage layer 20 as desired. As the device 100 cools, the antiferromagnetic orientation of antiferromagnetic layer 10 is restored, which pins the storage layer 20 in the desired direction parallel to the write field.

During reading, a heating current is not applied (by the voltage source 75) and the magnetic orientation of the ferromagnetic storage layer 20 is pinned to the same direction as the magnetic orientation of the top sublattice in the antiferromagnetic layer 10, and therefore, is not switched by the external magnetic field. To read the device 100, when the magnetic orientation of the ferromagnetic sense layer 40 is parallel (i.e., the same direction) to the magnetic orientation of the ferromagnetic storage layer 20, the state of the device 100 (MTJ 15) is 1. When the magnetic orientation of the ferromagnetic sense layer 40 is anti-parallel (i.e., opposite directions) to the magnetic orientation of the ferromagnetic storage layer 20, the state of the device 100 (MTJ 15) is 0.

The non-magnetic tunnel barrier 15 may be $Al_2O_3$ or MgO. The antiferromagnetic layer 10 may be IrMn, FeMn, PtMn, or an alloy or multilayer of these materials or any another metallic antiferromagnet. Layers 40 and 60 may be alloys containing at least one of Fe, Co, and Ni (or any combination thereof), such as for example, CoFeB. Also, the layers 40 and 60 may be CoFeTaB alloys or multilayers. Layers 50 and 60 may be a metal nitride such as TaN or TiN. Layers 70 may be a pure metal such as Cu or Al.

Figure 2:
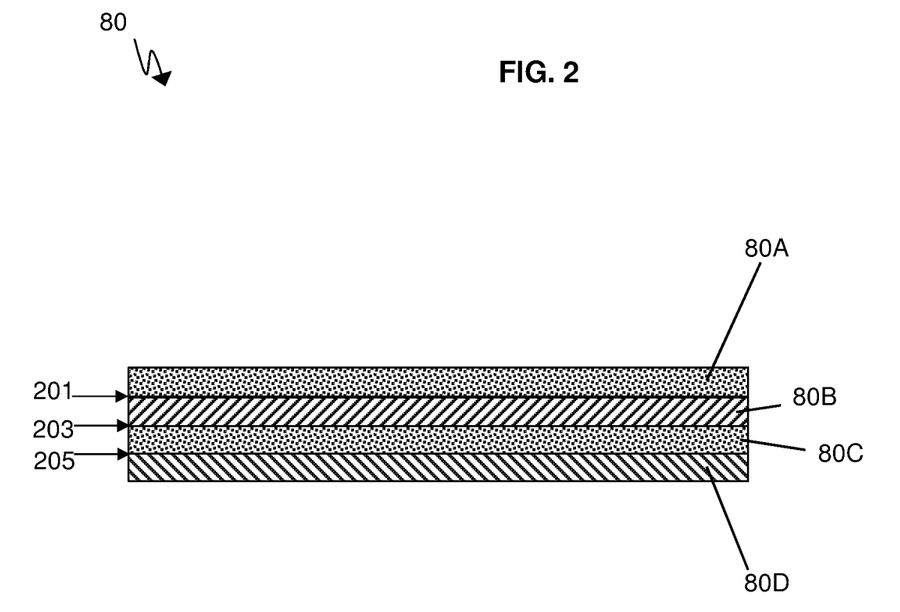
FIG. 2 illustrates an enlarged cross-sectional view of a multilayer dielectric encapsulant utilized in FIG. 1 according to an embodiment.

FIG. 2 illustrates an enlarged cross-sectional view of the multilayer dielectric encapsulant 80 utilized in FIG. 1 according to an embodiment. For ease of understanding, all the elements in FIG. 1 are not repeated but are understood to apply. The multilayer dielectric encapsulant 80 is characterized by having at least two (or more) layers of adjacent dielectric materials (80A-80D). Each individual dielectric material 80A, 80B, 80C, and 80D is a distinct and separate layer from its respective adjacent layer. Two adjacent dielectric materials of the multilayer dielectric encapsulant 80 are physically touching so as to form an interface at their meeting points. For example, FIG. 2 shows interface 201 at the junction of adjacent dielectric materials 80A and 80B, interface 203 at the junction of adjacent dielectric materials 80B and 80C, and interface 205 at the junction of adjacent dielectric materials 80C and 80D. As more layers of dielectric materials 80A-80D are added (or repeating the same materials), additional interfaces are then formed in the multilayer dielectric encapsulant 80 to further reduce the transfer of phonons, thus reducing the flow of heat escaping from the non-magnetic tunnel barrier 30 to the surrounding substrate 90. The surrounding substrate 90 may be silicon and/or may represent other devices 100.

Although only four dielectric material layers of dielectric materials 80A-80D are shown, it is contemplated that the encapsulant 80 may include 2, 3, 4, 5, 6 . . . 10, 11, 12 or more layers of different dielectric materials, may include 2 or more (3, 4, 5, 6 . . . 10, 11, 12) repeating combinations of dielectric materials, and/or may include two or more layers of the same dielectric material where each (or at least each adjacent layer of dielectric material) is disposed with a different deposition technique or under different conditions.

As noted above, each of the adjacent (i.e., touching) dielectric materials 80A-80D of the multilayer dielectric encapsulant 80 may differ in crystal lattice properties, in density/hardness, in deposition techniques, in material of the dielectric, and/or in some other way as discussed herein. The following are definitions which assist in understanding various differences that may be applied to the dielectric materials 80A-80D of the multilayer dielectric encapsulant 80.

Crystal lattice properties: The crystal lattice is the periodic and systematic arrangement of atoms that are found in crystals with the exception of amorphous solids and gases. In the simplest of terms, the crystal lattice can be considered as the points of intersection between straight lines in a three-dimensional network. The physical properties of crystals like cleavage, electronic band structure and optical transparency are predominantly governed by the crystal lattice. A unit cell is the smallest component of the crystal lattice and describes the arrangement of atoms in a crystal. The unit cell is characterized by its lattice parameters which consist of the length of the cell edges and the angles between them. There are seven crystal lattice systems, namely: monoclinic, triclinic, orthorhombic, rhombohedral, tetragonal, hexagonal and cubic. All seven of these crystal lattice systems their own variants, giving rise to a total of 14 Bravais Lattices. Among these seven lattice systems, the cubic system exhibits the symmetry of a cube is considered to be the simplest and also the most symmetric of all crystal lattices. There are three different types of cubical crystal lattice systems, namely: simple cubic (SC), body centered cubic (BBC), and face centered cubic (FCC). As the name indicates, simple cubic is the simplest form of the structure. The simple cubic unit cell has one lattice point at each of the eight corners of the cube. The unit cell of a BBC crystal lattice contains one host atom in the center of the cube and one each at the corner of the cube. The unit cells in FCC have one host atom at each corner and one host atom on each face. Vectors and atomic planes in a crystal lattice can be described by a three-value Miller index notation (lmn). The l, m, and n directional indices are separated by 90°, and are thus orthogonal. In fact, the l component is mutually perpendicular to the m and n indices.

Density/hardness: Young's modulus, also known as the tensile modulus or elastic modulus, is a measure of the stiffness of an elastic material and is a quantity used to characterize materials. It is defined as the ratio of the stress along an axis over the strain along that axis in the range of stress in which Hooke's law holds. In solid mechanics, the slope of the stress-strain curve at any point is called the tangent modulus. The tangent modulus of the initial, linear portion of a stress-strain curve is called Young's modulus. It can be experimentally determined from the slope of a stress-strain curve created during tensile tests conducted on a sample of the material. In anisotropic materials, Young's modulus may have different values depending on the direction of the applied force with respect to the material's structure. Young's modulus is the most common elastic modulus, sometimes called the modulus of elasticity.

Lattice constant or lattice parameter: The lattice constant, or lattice parameter, refers to the constant distance between unit cells in a crystal lattice. Lattices in three dimensions generally have three lattice constants, referred to as "a", "b", and "c". However, in the special case of cubic crystal structures, all of the constants are equal and are only referred to as "a". Similarly, in hexagonal crystal structures, the "a" and "b" constants are equal, and one only refers to the "a" and "c" constants. A group of lattice constants could be referred to as lattice parameters. However, the full set of lattice parameters consist of the three lattice constants and the three angles between them. Lattice constants have the dimension of length (e.g., the SI unit is the meter). Lattice constants are typically on the order of several angstroms (i.e., tenths of a nanometer).

Deposition techniques: Thin film deposition is the act of applying a thin film to a surface which is any technique for depositing a thin film of material onto a substrate or onto previously deposited layers. Thin is a relative term, but most deposition techniques control layer thickness within a few tens of nanometers. Molecular beam epitaxy allows a single layer of atoms to be deposited at a time. Deposition techniques fall into two broad categories, depending on whether the process is primarily chemical or physical. Chemical vapor deposition utilizes a fluid precursor that undergoes a chemical change at a solid surface, leaving a solid layer. Chemical deposition is further categorized by the phase of the precursor and examples of chemical deposition include, but are not limited to: plating; chemical solution deposition (CSD) or chemical bath deposition (CBD); spin coating or spin casting; chemical vapor deposition (CVD); plasma enhanced CVD (PECVD); atomic layer deposition (ALD); and so forth.

Physical vapor deposition (PVD) uses mechanical, electromechanical, or thermodynamic means to produce a thin film of solid. Examples of physical deposition include but are not limited to: a thermal evaporator (i.e., molecular beam epitaxy); an electron beam evaporator; sputtering; pulsed laser deposition; cathodic arc physical vapor deposition (arc-PVD); electrohydrodynamic deposition (electrospray deposition); reactive PVD; and so forth.

With reference to FIG. 2, example layers are discussed in the multilayer dielectric encapsulant 80. Adjacent dielectric materials 80A and 80B have to differ as discussed herein because they form interface 201, and dielectric material 80C may be the same as non-touching dielectric material 80A but differs from adjacent dielectric material 80B because dielectric materials 80B and 80C form interface 203. Dielectric material 80D has to differ from adjacent dielectric material 80C because they form interface 205 but dielectric material 80D may be the same as (either) dielectric materials 80A and 80B because dielectric material 80D does not interface with dielectric materials 80A and/or 80B. This same analogy of adjacent dielectric materials that form interfaces applies for any additional layers of dielectric materials (more than the example 4 layers shown in FIG. 2). The multilayer dielectric encapsulant 80 may have two different adjacent dielectric materials 80A and 80B that repeat for the remaining layers of the dielectric materials such that all touching dielectric materials (i.e., forming an interface) differ as discussed herein.

Some examples of interfacing (i.e., adjacent as in touching) dielectric materials as a stack in the multilayer dielectric encapsulant 80 are discussed below. Although individual examples are provided, the examples can be combined in any manner.

The multilayer dielectric encapsulant 80 may have two or more layers of different adjacent dielectric materials such as aluminum oxide/silicon oxide/aluminum oxide/aluminum oxide as the stack of dielectric materials 80A/80B/80C/80D.

The multilayer dielectric encapsulant 80 may have two or more layers of different adjacent dielectric materials such as soft dielectric/hard dielectric/soft dielectric/hard dielectric as the stack of dielectric materials 80A/80B/80C/80D. As such, this can be implemented as dielectric materials with various stiffnesses such as a low Young's modulus/high Young's modulus/low Young's modulus/high Young's modulus for dielectric materials 80A/80B/80C/80D. As an example, the stack of adjacent dielectric materials may be alternating layers of silicon oxide and silicon nitride.

The multilayer dielectric encapsulant 80 may have two or more layers of different adjacent dielectric materials such as small lattice constant/large lattice constant/small lattice constant/large lattice constant as the stack of dielectric materials 80A/80B/80C/80D, small lattice constant/large lattice constant/medium lattice constant/small lattice constant, and so forth. Also, the lattice constant may be identified with the plane of the crystal structure that is parallel to the film plane such that the two or more layers of different dielectric materials may be, e.g., [1,1,1]/[0,0,1]/[1,1,1]/[0,0,1] as dielectric materials 80A/80B/80C/80D. As an example, the stack of adjacent dielectric materials may be alternating layers of aluminum oxide (lattice constant=4.78 Angstroms) and silicon (lattice constant=5.43 Angstroms).

The multilayer dielectric encapsulant 80 may have two or more layers of different adjacent dielectric materials with different crystal structures (different lattice structures) such as SC/BCC/SC/BCC as the stack of dielectric materials 80A/80B/80C/80D, such as FCC/SC/BCC/FCC, and so forth. As an example, the stack of adjacent dielectric materials may be alternating layers of aluminum oxide (hexagonal structure) and silicon (diamond cubic structure).

The multilayer dielectric encapsulant 80 may have two or more layers of different adjacent dielectric materials such as amorphous dielectric material/crystalline dielectric material/amorphous dielectric material/crystalline dielectric material as the stack of dielectric materials 80A/80B/80C/80D. Note that an amorphous dielectric material has no clear crystalline structure. In this case, an example of the stack of adjacent dielectric materials may be alternating layers of aluminum oxide (hexagonal) and TaN (amorphous).

The multilayer dielectric encapsulant 80 may have two or more layers of the same adjacent dielectric materials (note that these examples also apply for different dielectric materials) which have be deposited/formed using different deposition techniques and/or using different deposition conditions (under the same deposition technique or different deposition techniques). Deposition refers to depositing or forming the layer of the dielectric material 80D, then depositing/forming the layer of the dielectric material 80C, subsequently depositing/forming the layer of the dielectric material 80B, and depositing/forming the layer of the dielectric material 80A, and so forth until the desired number of separate dielectric layers are formed. For two or more layers of the same adjacent dielectric materials, different deposition conditions for the same deposition technique may include utilizing different temperatures when depositing the two or more layers, utilizing different ambient environments when depositing the two or more layers, utilizing different pressures when depositing the two or more layers, etc. For different deposition conditions, the encapsulant 80 may have two or more layers of the same adjacent dielectric materials (e.g., silicon dioxide) that may be deposited with the lowest suitable temperature (for silicon dioxide)/highest suitable temperature (for silicon dioxide)/lowest suitable temperature (for silicon dioxide)/highest suitable temperature (for silicon dioxide) as the stack of the same dielectric material 80A/80B/80C/80D. With regard to different deposition techniques, the multilayer dielectric encapsulant 80 again may have two or more layers of the same adjacent dielectric materials (e.g., silicon dioxide) deposited/formed with a first suitable deposition technique/a second suitable deposition technique/the first (or different than second) suitable technique/second suitable deposition technique as the stack of the same dielectric material 80A/80B/80C/80D. Note that the first suitable deposition technique can differ from the second suitable deposition technique in the following: (1) a chemical vapor deposition (CVD) technique versus a physical vapor deposition technique (PVD), (2) two different CVD techniques, (3) two different PVD techniques, and combinations thereof; the desired differences in deposition techniques can be repeated as more layers of the same dielectric material are added to the stack of dielectric material 80A-80D.

The dielectric materials 80A, 80B, 80C, and 80D may each have a thickness in a range of 50-200 Angstroms, and particularly, each dielectric material 80A, 80B, 80C, and 80D may each have a thickness of 50 Angstroms.

Figure 3:
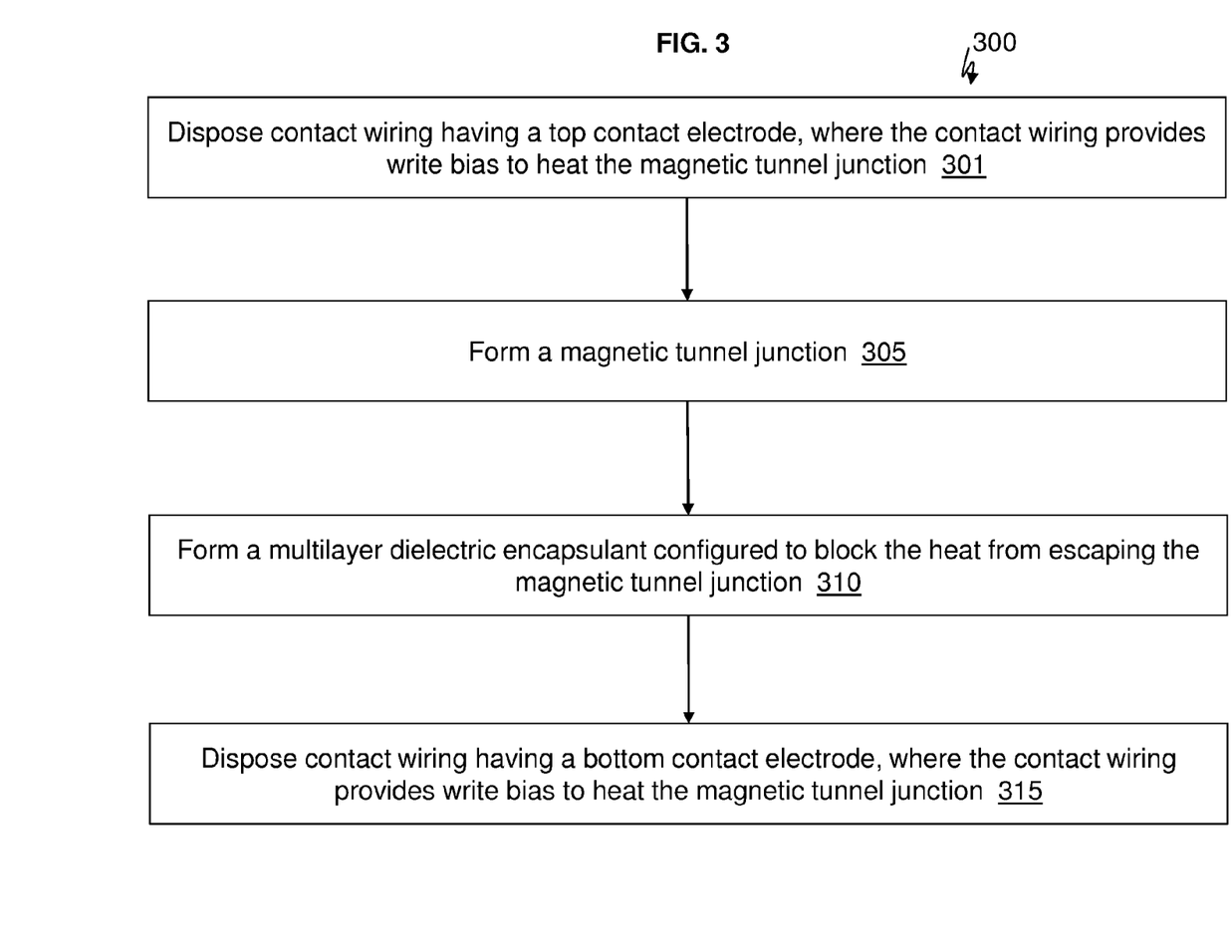
FIG. 3 illustrates a method of fabricating a thermally assisted magnetoresistive random access memory device according to an embodiment.

FIG. 3 illustrates a method 300 of fabricating a thermally assisted magnetoresistive random access memory device 100 according to an embodiment.

Contact wiring having a top contact electrode 70 is disposed, in which the contact wiring provides write bias to heat the magnetic tunnel junction 15 at block 301.

A magnetic tunnel junction 15 is formed at block 305. The magnetic tunnel junction 15 includes the ferromagnetic storage layer 20, the non-magnetic tunnel barrier 30, and the ferromagnetic storage layer 40.

A multilayer dielectric encapsulant 80 is formed and the multilayer dielectric encapsulant 80 is configured to block the heat from escaping the magnetic tunnel junction 15 at block 310.

The multilayer dielectric encapsulant 80 surrounds the magnetic tunnel junction 15. The multilayer dielectric encapsulant 80 abuts the layers of the magnetic tunnel junction 15 to provide a multilayer thermal barrier. The multilayer dielectric encapsulant 80 includes at least a first dielectric material 80A and a second dielectric material 80B (and other dielectric materials 80C, 80D, and additional dielectric materials).

Contact wiring having a bottom contact electrode 60 is disposed, in which the contact wiring provides write bias to heat the magnetic tunnel junction 15 at block 315.

The first dielectric material is adjacent to the second dielectric material (e.g., as shown in FIG. 2). The first dielectric material and the second dielectric material are different materials in one case.

In another case, the first dielectric material and the second dielectric material are the same materials, and the first dielectric material is deposited by a first deposition technique while the second dielectric material is deposited by a second deposition technique different from the first deposition technique.

The first dielectric material and the second dielectric material have different Young's modulus numbers. The first dielectric material and the second dielectric material have different lattice constants. The first dielectric material and the second dielectric material have different crystal structures, and the crystal structures refer to a crystal orientation of the first dielectric material and the second dielectric material.

When the first dielectric material and the second dielectric material are the same materials or different materials, at least one of or a combination of a following: the first dielectric material is deposited by a first deposition technique and the second dielectric material is deposited by a second deposition technique different from the first deposition technique; the first dielectric material and the second dielectric material have different Young's modulus numbers; the first dielectric material and the second dielectric material have different lattice constants; the first dielectric material and the second dielectric material have different crystal structures (where the crystal structures refer to a crystal orientation of the first dielectric material and the second dielectric material); and the first dielectric material is crystalline material and the second dielectric material is amorphous material.

Figure 4:
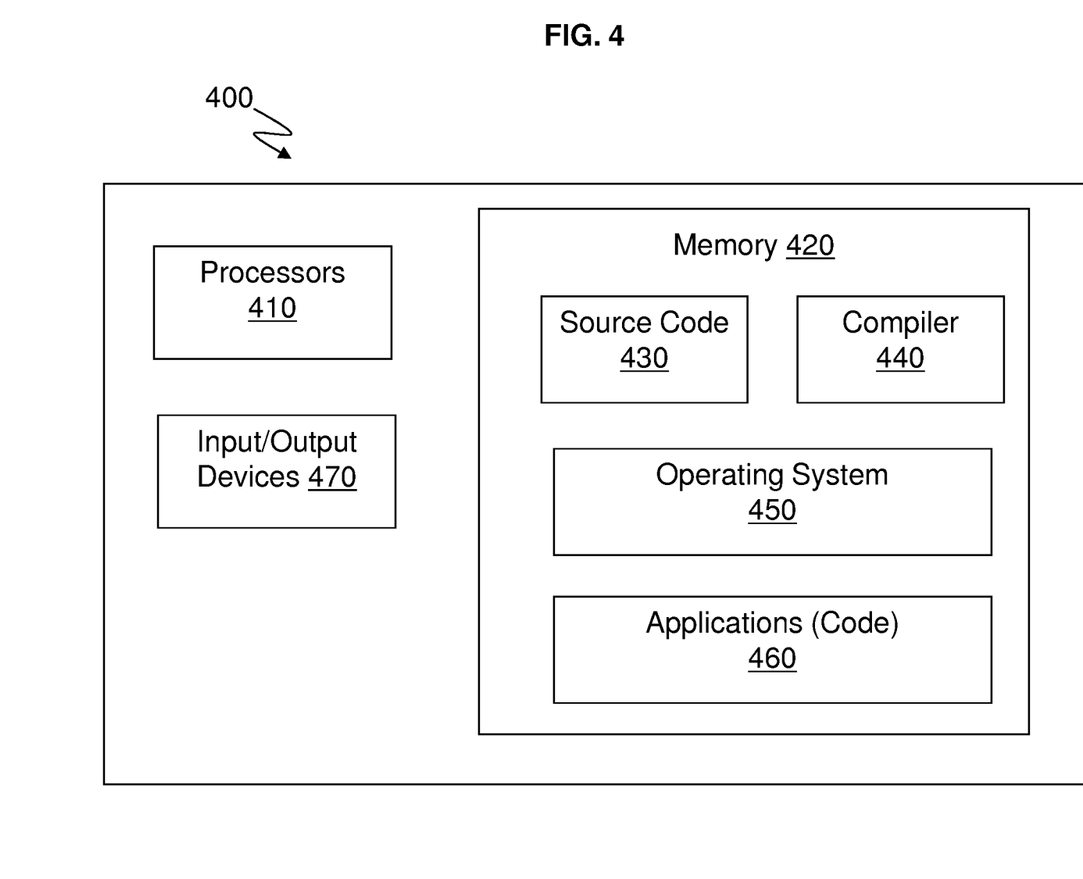
FIG. 4 is an example of a computer which can be connected to, operate, and/or include an array of TAS-MRAM devices according to an embodiment.

FIG. 4 illustrates an example of a computer 400 which may include and/or operate the MRAM device 100 (e.g., such as an array of MRAM devices 100) as memory 420. Various methods, procedures, modules, flow diagrams, tools, applications, circuits, elements, and techniques discussed herein may also incorporate and/or utilize the capabilities of the computer 400. Moreover, capabilities of the computer 400 may be utilized to implement features of exemplary embodiments discussed herein including the voltage source 75 and the logic circuitry to operate an array of MRAM devices 100 (as understood by one skilled in the art). One or more of the capabilities of the computer 400 may be utilized to implement, to incorporate, to connect to, and/or to support any element discussed herein (as understood by one skilled in the art) in FIGS. 1-3.

Generally, in terms of hardware architecture, the computer 400 may include one or more processors 410, computer readable storage memory 420, and one or more input and/or output (I/O) devices 470 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 410 is a hardware device for executing software that can be stored in the memory 420. The processor 410 can be virtually any custom made or commercially available processor, a central processing unit (CPU), a data signal processor (DSP), or an auxiliary processor among several processors associated with the computer 400, and the processor 410 may be a semiconductor based microprocessor (in the form of a microchip) or a microprocessor.

The computer readable memory 420 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 420 may incorporate electronic, magnetic, optical, and/or other types of storage media. Note that the memory 420 can have a distributed architecture, where various components are situated remote from one another, but can be accessed by the processor 410.

The software in the computer readable memory 420 may include one or more separate programs, each of which comprises an ordered listing of executable instructions for implementing logical functions. The software in the memory 420 includes a suitable operating system (O/S) 450, compiler 440, source code 430, and one or more applications 460 of the exemplary embodiments. As illustrated, the application 460 comprises numerous functional components for implementing the features, processes, methods, functions, and operations of the exemplary embodiments. The application 460 of the computer 400 may represent numerous applications, agents, software components, modules, interfaces, controllers, etc., as discussed herein but the application 460 is not meant to be a limitation.

The operating system 450 may control the execution of other computer programs, and provides scheduling, input-output control, file and data management, memory management, and communication control and related services.

The application 460 may be a source program, executable program (object code), script, or any other entity comprising a set of instructions to be performed. When a source program, then the program is usually translated via a compiler (such as the compiler 440), assembler, interpreter, or the like, which may or may not be included within the memory 420, so as to operate properly in connection with the O/S 450. Furthermore, the application 460 can be written as (a) an object oriented programming language, which has classes of data and methods, or (b) a procedure programming language, which has routines, subroutines, and/or functions.

The I/O devices 470 may include input devices (or peripherals) such as, for example but not limited to, a mouse, keyboard, scanner, microphone, camera, etc. Furthermore, the I/O devices 470 may also include output devices (or peripherals), for example but not limited to, a printer, display, etc. Finally, the I/O devices 470 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 470 also include components for communicating over various networks, such as the Internet or an intranet. The I/O devices 470 may be connected to and/or communicate with the processor 410 utilizing Bluetooth connections and cables (via, e.g., Universal Serial Bus (USB) ports, serial ports, parallel ports, FireWire, HDMI (High-Definition Multimedia Interface), etc.).

When the computer 400 is in operation, the processor 410 is configured to execute software stored within the memory 420, to communicate data to and from the memory 420, and to generally control operations of the computer 400 pursuant to the software. The application 460 and the O/S 450 are read, in whole or in part, by the processor 410, perhaps buffered within the processor 410, and then executed.

When the application 460 is implemented in software it should be noted that the application 460 can be stored on virtually any computer readable storage medium for use by or in connection with any computer related system or method.

The application 460 can be embodied in any computer-readable medium for use by or in connection with an instruction execution system, apparatus, server, or device, such as a computer-based system, processor-containing system, or other system that can fetch the instructions from the instruction execution system, apparatus, or device and execute the instructions.

In exemplary embodiments, where the application 460 is implemented in hardware, the application 460 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of fabricating a thermally assisted magnetoresistive random access memory device, comprising:
    forming a magnetic tunnel junction;
    disposing contact wiring having a top contact electrode and a bottom contact electrode, the contact wiring providing write bias to heat the magnetic tunnel junction;
    forming a multilayer dielectric encapsulant configured to retain the heat within the magnetic tunnel junction, wherein the multilayer dielectric encapsulant surrounds the magnetic tunnel junction;
    wherein the multilayer dielectric encapsulant includes at least a first dielectric material and a second dielectric material the first dielectric material being adjacent to the second dielectric material;
    improving interfacial thermal resistance of the multilayer dielectric encapsulant by configuring the first dielectric material and the second dielectric material to comprise differences of:
    the first dielectric material and the second dielectric material are different materials;
    the first dielectric material and the second dielectric material have different lattice constants; and
    the first dielectric material and the second dielectric material have different crystal structures, wherein one is amorphous dielectric material and another is crystalline dielectric material.

2. The method of claim 1, wherein the multilayer dielectric encapsulant surrounds the magnetic tunnel junction.

3. The method of claim 2, wherein the multilayer dielectric encapsulant abuts the magnetic tunnel junction;
    wherein the multilayer dielectric encapsulant further includes a third dielectric material adjacent to the second dielectric material and a fourth dielectric material adjacent to the third dielectric material;
    wherein the interfacial thermal resistance of the multilayer dielectric encapsulant is further improved by having different properties for each adjacent layer of the multilayer dielectric encapsulant, such that the first dielectric material has different properties from the second dielectric material, the second dielectric material has different properties from the third dielectric material, and the third dielectric material has different properties from the fourth dielectric material;
    wherein non-adjacent layers of the multilayer dielectric encapsulant are allowed to have same properties, such that the first and third dielectric materials can have the same properties and the second and fourth dielectric materials can have the same properties.

4. The method of claim 1,
    wherein the first dielectric material is deposited by a first deposition technique; and
    wherein the second dielectric material is deposited by a second deposition technique different from the first deposition technique.

5. The method of claim 1, wherein the first dielectric material and the second dielectric material have different Young's modulus numbers.

6. The method of claim 1,
    wherein the crystal structures refer to a crystal orientation of the first dielectric material and the second dielectric material.

7. The method of claim 1, wherein an antiferromagnetic layer is adjacent to the magnetic tunnel junction, such that the multilayer dielectric encapsulant further surrounds the antiferromagnetic layer.

* * * * *